United States Patent
Rice et al.

(10) Patent No.: US 7,230,702 B2
(45) Date of Patent: Jun. 12, 2007

(54) MONITORING OF SMART PIN TRANSITION TIMING

(75) Inventors: Michael R. Rice, Pleasanton, CA (US); Eric A. Englhardt, Palo Alto, CA (US); Robert B. Lowrance, Los Gatos, CA (US); Martin R. Elliott, Round Rock, TX (US); Jeffrey C. Hudgens, San Francisco, CA (US); Kirk Van Katwyk, Tracy, CA (US); Amitabh Puri, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 166 days.

(21) Appl. No.: 10/987,950

(22) Filed: Nov. 12, 2004

(65) Prior Publication Data

US 2005/0122504 A1   Jun. 9, 2005

Related U.S. Application Data

(60) Provisional application No. 60/520,038, filed on Nov. 13, 2003.

(51) Int. Cl.
*G01B 11/00* (2006.01)
*H01L 21/677* (2006.01)
*B65B 21/02* (2006.01)

(52) U.S. Cl. ............... 356/400; 414/217; 414/811

(58) Field of Classification Search ............... 356/400; 414/217, 811
See application file for complete search history.

(56) References Cited

U.S. PATENT DOCUMENTS 4,376,482 A    3/1983   Wheeler et al.

(Continued)

FOREIGN PATENT DOCUMENTS

EP    0472536 B1    12/1994

(Continued)

OTHER PUBLICATIONS

Martin, et al., "Design Criteria for 300 mm Silicon Wafer Carriers, Material Handling Systems & Tools", 1995, Proceedings of the 41st Annual Technical Meeting of the Institute of Environmental Sciences, pp. 107-117.

(Continued)

*Primary Examiner*—Layla G. Lauchman
*Assistant Examiner*—J. Underwood
(74) *Attorney, Agent, or Firm*—Dugan & Dugan (57) ABSTRACT

A movable portion of a substrate carrier handler is extended into a transport path along which a substrate carrier transport system transports a substrate carrier, respective kinematic coupling events are detected between corresponding interface elements of the movable portion and the substrate carrier, respective signals are generated in response thereto, and an alignment offset between the substrate carrier and the substrate carrier transport system is determined based on the signals. A movable portion matches an elevation, position, and/or a speed/velocity of a substrate carrier moving along the transport path. Sensors for detecting kinematic coupling and generating signals in response thereto are provided on the movable portion. An end effector includes a support with interface elements and sensors for detecting kinematic coupling and generating respective signals. A substrate carrier handler includes a movable portion, interface elements, sensors, and a controller for receiving signals and determining an alignment offset.

57 Claims, 4 Drawing Sheets

U.S. PATENT DOCUMENTS

| | | | | |
|---|---|---|---|---|
| 4,770,590 | A * | 9/1988 | Hugues et al. | 414/172 |
| 4,805,759 | A * | 2/1989 | Rochet et al. | 198/346.1 |
| 5,092,557 | A * | 3/1992 | Sawatzki | 248/542 |
| 5,207,309 | A * | 5/1993 | Simpkin et al. | 198/341.09 |
| 5,409,348 | A * | 4/1995 | Suzuki | 414/811 |
| 5,551,348 | A * | 9/1996 | Matsumoto | 104/88.02 |
| 5,639,234 | A * | 6/1997 | Ono et al. | 432/152 |
| 5,664,337 | A * | 9/1997 | Davis et al. | 34/58 |
| 5,783,834 | A | 7/1998 | Shatas | |
| 5,788,454 | A * | 8/1998 | Thompson et al. | 414/811 |
| 5,822,498 | A * | 10/1998 | Kumasaka et al. | 700/252 |
| 5,970,621 | A | 10/1999 | Bazydola et al. | |
| 5,980,183 | A | 11/1999 | Fosnight | |
| 6,075,334 | A | 6/2000 | Sagues et al. | |
| 6,242,879 | B1 | 6/2001 | Sagues et al. | |
| 6,275,742 | B1 | 8/2001 | Sagues et al. | |
| 6,298,280 | B1 | 10/2001 | Bonora et al. | |
| 6,304,051 | B1 * | 10/2001 | Sagues et al. | 318/568.11 |
| 6,323,616 | B1 | 11/2001 | Sagues et al. | |
| 6,366,830 | B2 | 4/2002 | Bacchi et al. | |
| 6,389,707 | B1 | 5/2002 | Peiter et al. | |
| 6,453,214 | B1 | 9/2002 | Bacchi et al. | |
| 6,530,736 | B2 | 3/2003 | Rosenquist | |
| 6,579,052 | B1 | 6/2003 | Bonora et al. | |
| 6,746,197 | B2 * | 6/2004 | Kimura et al. | 414/217 |
| 6,942,738 | B1 * | 9/2005 | Nelson et al. | 134/33 |
| 2002/0015633 | A1 * | 2/2002 | Fosnight et al. | 414/222.01 |
| 2002/0114684 | A1 | 8/2002 | Jeong et al. | |
| 2005/0095110 | A1 * | 5/2005 | Lowrance et al. | 414/736 |

FOREIGN PATENT DOCUMENTS

| | | |
|---|---|---|
| EP | 0556193 B1 | 12/1995 |
| GB | 2 348 634 A | 10/2000 |
| JP | 08-148538 | 6/1996 |
| WO | WO 96/09787 | 4/1996 |

OTHER PUBLICATIONS

Weiss, Mitchell, "Evaluating 300-mm Fab Automation Technology Options and Selection Criteria", Jun. 1997, MICRO, vol. 15, No. 6, pp. 65-66, 68, 70, 72, 74, 76, 78-79.

No-Author, "Equipe Helps Streamline 300 mm Wafer Processing", Dec. 1, 1997, Manufacturing Automation, vol. 7, No. 3, p. 1-5.

* cited by examiner

MONITORING OF SMART PIN TRANSITION TIMING

This application claims priority to U.S. Provisional Patent Application Ser. No. 60/520,038, filed Nov. 13, 2003, entitled "MONITORING OF SMART PIN TRANSITION TIMING," the content of which is hereby incorporated herein by reference in its entirety for all purposes.

FIELD OF THE INVENTION

The present invention relates to the field of transporting substrate carriers within a manufacturing facility. More specifically, the present invention relates to picking and placing substrate carriers on and off transport systems for moving substrates between substrate processing stations, and between remote storage locations and substrate processing stations.

BACKGROUND

Given the well-known fragility of semiconductor substrates, it is imperative that all necessary steps be taken to protect them against damage from incidental or accidental bumps and/or impacts. For example, although substrates are commonly stored in substrate carriers for protection during storage or while in transit to substrate processing stations, it is desirable to reduce the risk of substrate carriers being bumped or struck, so as to prevent shifting, sliding or dislodgment of the in-process substrates they contain.

Substrate carriers are often moved through relatively long distances within a manufacturing facility, e.g., from remote storage to a substrate processing station, or between processing stations. For this purpose, substrate carriers may be loaded onto well-controlled substrate carrier transport systems adapted to quickly traverse those distances, and navigate paths which may include one or more turns, so as to deliver the substrate carriers to their next destination safely. Nevertheless, an opportunity for transmitting shock and vibration energy to in-process substrates through the substrate carriers that contain them exists in the processes used to pick and place substrate carriers onto and off of such transport systems.

Accordingly, effective methods and apparatus are needed to minimize the potential for damage to stored substrates when substrate carriers are loaded onto and unloaded from substrate carrier transport systems.

SUMMARY OF THE INVENTION

In a first embodiment, a method of determining an alignment offset between a substrate carrier handler and a substrate carrier transport system is provided. The method includes providing a substrate carrier handler having a movable portion for extending into a transport path along which a substrate carrier transport system transports substrate carriers. The movable portion may be moved into the transport path, and a first and second event may be detected, each event involving an interface element (e.g., a kinematic pin) of the movable portion kinematically coupling with a complementary interface element (e.g., a kinematic groove) of the substrate carrier. Respective first and second signals may be generated in response to the first and second events, and an alignment offset between the substrate carrier and the substrate carrier transport system may be determined based on the first and second signals. In some such embodiments, the movable portion of the substrate carrier handler may be caused to match one or more of an elevation of the substrate carrier, a position of the substrate carrier along the transport path, and a velocity and/or speed of the substrate carrier along the transport path. In some other such embodiments, sensors for detecting the first and second events may be mounted, in part or entirely, on the movable portion, and such sensors may be integrated with/within their respective interface elements.

In a second embodiment, a substrate carrier handler end effector is disclosed having a support for extending into a transport path along which substrate carriers are transported, the support having a plurality of interface elements, and each interface element may kinematically couple with a complementary interface element of a substrate carrier being transported. Corresponding sensors are coupled to the support for detecting kinematic coupling events between respective pairs of interface elements and generating respective signals in response to the same. The signals may be used to determine an alignment offset between the end effector and the substrate carrier.

In a third embodiment, a substrate carrier is disclosed having a movable portion that may extend into a transport path along which a substrate carrier transport system transports a substrate carrier. The movable portion has a plurality of interface elements adapted to kinematically couple with respective complementary interface elements of the substrate carrier. The substrate carrier also has first and second sensors for detecting respective first and second events in which a first and second interface element of the movable portion kinematically couple with a complementary first and second interface element of the substrate carrier, and for generating respective first and second signals in response thereto. The substrate carrier handler also includes a controller for receiving the first and second signals and determining an alignment offset between the substrate carrier handler and the substrate carrier transport system based on the first and second signals.

Other features and aspects of the present invention will become more fully apparent from the following detailed description, the appended claims and the accompanying drawings.

DETAILED DESCRIPTION

Establishing good alignment between end effectors of substrate carrier handlers and handling features of substrate carriers, and repeatably maintaining such alignment over time, are important parts of any method used to pick and place substrate carriers onto and off a substrate carrier transport system. Many known systems accomplish these functions via specially designed stockers, located at the mouths of clean room bays, which bays in turn connect to central clean room transport aisles, through which an inter-bay transport system transports substrate carriers. Generally intended for permanent installation as part of a dedicated facility, such stockers can be expensive, but often comprise simple robots dedicated solely to smoothly picking and placing substrate carriers and displacing them a short distance to storage or to a means for transporting them to one of a plurality of substrate processing stations distributed around the bay. An example of such a stocker is disclosed in copending U.S. patent application Ser. No. 09/517,227, filed Mar. 2, 2000, which is hereby incorporated herein in its entirety.

More advanced systems utilize stockers which are distributed around the bays themselves, such that a given substrate processing station may be equipped with a dedicated stocker adapted to pick and place substrate carriers onto and off of a substrate carrier transport system, deliver and retrieve substrate carriers to and from docking stations associated with a factory interface (e.g., a device disposed outside the clean room and between the clean room wall and a processing station, and adapted to retrieve substrates (for processing) through the clean room wall from a substrate carrier disposed on a docking station, and return (processed) substrates back through the clean room wall to the substrate carrier) of the processing station, and/or deliver and retrieve substrate carriers to storage shelves of the stocker. Such stockers may further comprise a convenient, modular frame to which a substrate carrier handler of the stocker may be coupled, and on which the substrate carrier handler may be supported at a convenient location that enables it to selectively interact with the transport system and the factory interface with equal facility. An example of such a stocker is disclosed in copending U.S. patent application Ser. No. 10/444,530, filed May 23, 2003, which is hereby incorporated herein in its entirety.

Still further, more recently developed systems utilize stockers equipped with more capable substrate carrier handlers adapted to pick and place substrate carriers onto and off of the transport system without requiring the transport system to stop, or even to slow its speed of rotation as may be the case with the above-discussed stockers. Such substrate carriers handlers, also known as high-speed substrate carrier handlers, may be adapted to move their end effectors laterally at a higher than normal speed so as to match a speed at which the transport system transports substrate carriers between processing stations and/or between bays of processing stations. As well, such stockers, also known as high-speed bay distributed stockers (e.g., because they support a high-speed substrate carrier handler), may comprise frames which, while still of modular construction, may be larger and more substantial so as to provide more stable support and/or greater space for storage of substrate carriers, for example. An example of such a stocker is disclosed in copending U.S. Provisional Patent Application Ser. No. 60/443,004, filed Jan. 27, 2003, which is hereby incorporated herein in its entirety.

Where alignment issues arise with regard to stockers (of the latter variety), the sources of such alignment issues may include angular misalignment between a preferred and an observed vertical path of motion of the end effector as it moves toward/within a path along which the transport system transports substrate carriers, and/or an angular misalignment between interface elements of the end effector and corresponding complementary interface elements of the substrate carrier. Either of these two types of misalignments may cause a discontinuity in the motion profile of in-process work pieces as the substrate carrier is lifted off of or placed upon substrate carrier supports of the transport system, and may represent an unwelcome source of potentially damaging impact, especially when combined with the higher lateral speeds at which substrate carriers must be removed in order to match the increasingly higher speeds of transport systems, such as in the latter system described above.

The present invention provides for observing/monitoring aspects of the state of alignment (e.g., the direction from which the end effector approaches a substrate carrier being transported, or the orientation of the end effector as it approaches the substrate carrier being transported) between a pick-and-place substrate carrier handler and a substrate carrier transport system, e.g., so as to provide confirmation of good alignment upon initial installation of a wafer carrier handler or a stocker, and/or to provide an indication of insufficient alignment such as may arise in the course of normal use of a wafer carrier handler or a stocker (e.g., as a result of a slackening of frame posture or part wear). For example, in a second embodiment, signals may be generated corresponding to certain events that may be expected to occur during picking or placing, and an alignment offset between a moveable portion of the substrate carrier handler and the transport system may be determined based on the signals.

In one or more embodiments, the just-mentioned events may each comprise an interface element of the moveable portion of the substrate carrier handler kinematically coupling with a complementary interface element of a substrate carrier supported by the transport system. In some such embodiments, sensors detect the events and generate the signals in response. Where a difference exists in the timing between the events, for instance, or in the distance through which the movable portion is observed to have moved leading up to one or more of the events, as compared to what would be expected if good alignment existed, an alignment offset may be determined to exist, and/or an extent or a directional component of an alignment offset may be determined so as to facilitate corrective action, such as an adjustment of frame posture.

In still further embodiments, the inventive apparatus and methods pertain to high-speed stockers comprising modular frames (e.g., free-standing and/or individually adjustable frames) to which high-speed substrate carrier handlers are coupled, and on which such substrate carrier handlers are supported for placement adjacent both a substrate carrier transport system and a factory interface of a substrate processing station, and further comprising, in some such embodiments, storage locations coupled to the frame for local storage of substrate carriers. Especially with respect to stockers supporting high-speed substrate carrier handlers, initial and continued alignment between the high-speed substrate carrier handler and the transport system is both a challenge, given the relatively high speeds and long throws (horizontal distances) involved, and important, given the higher potential for costly damage if alignment offsets grow outside of increasingly narrow acceptable ranges. The present invention is particularly adapted to help meet such challenges, and to do so in a relatively uncomplicated but effective manner.

Figure 1:
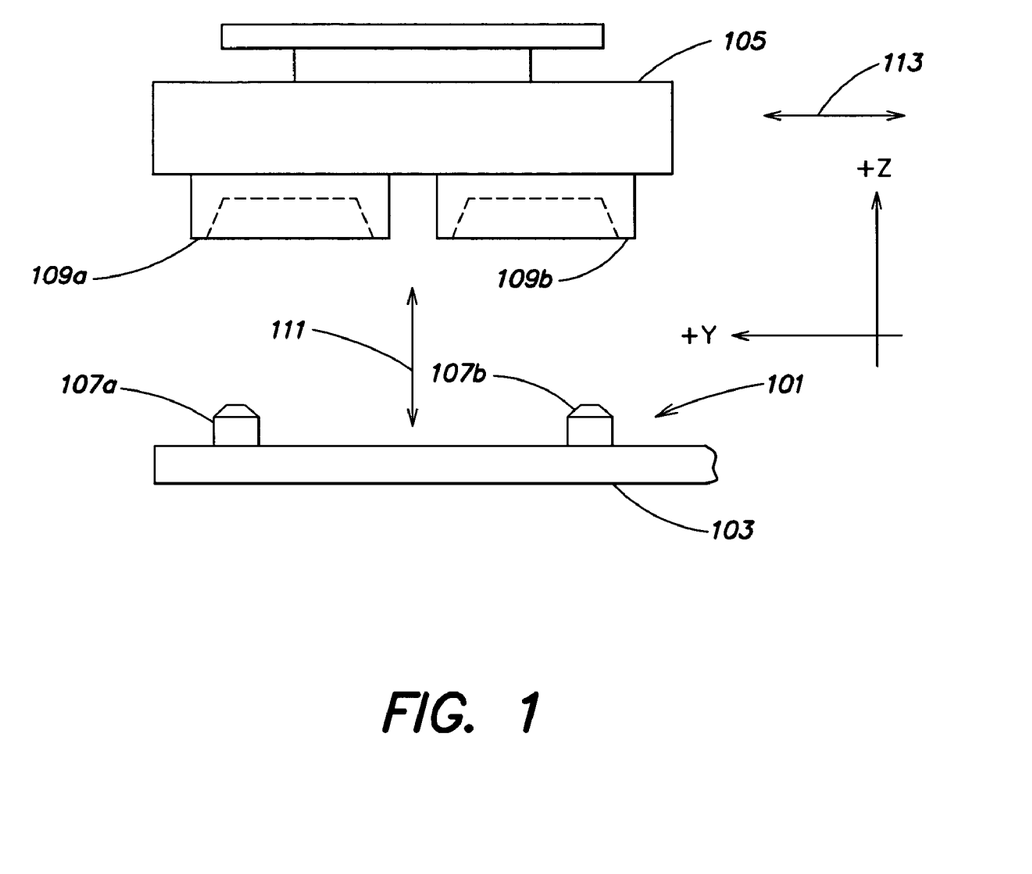
FIG. 1 is a side elevational view of an exemplary substrate transport apparatus in accordance with the present invention that may be employed so as to determine an alignment offset between a substrate carrier handler and a substrate carrier transport system.

FIG. 1 is a side view of an example of a substrate transport apparatus that may be employed in accordance with the present invention so as to determine an alignment offset between a substrate carrier handler and a substrate carrier transport system. For example, an end effector 101 of a substrate carrier handler may be provided for picking up and placing substrate carriers. The end effector 101 may include a support member 103 that may be relatively stiff and strong and may be oriented substantially horizontally, so as to reliably support a substrate carrier resting thereon and control against tipping during movement of the substrate carrier. In addition, a substrate carrier 105 may be provided that is adapted to contain one or more substrates (not shown) for secure storage during transit, and which may comprise a plurality of external features, e.g., external features designed to facilitate secure grasping of the substrate carrier 105, and/or accurate location of the substrate carrier 105 relative to corresponding features of related apparatus used for transporting or storing the substrate carrier 105.

The end effector 101 and the substrate carrier 105 may comprise corresponding parts of interface elements adapted to cooperate kinematically with one another so as to locate the substrate carrier 105 on the end effector 101 both horizontally (i.e., within the x-y plane) and as to height (i.e., location along the z-axis shown in FIG. 1) above the support member 103. For example, the end effector 101 may include a first interface element 107*a* and a second interface element 107*b* mounted in spaced relation on the support member 103, and the substrate carrier 105 may include complementary first and second interface elements 109*a*, 109*b* provided in spaced relation on a bottom surface of the substrate carrier 105. As shown in FIG. 1, the first and second interface elements 107*a*, 107*b* of the end effector 101 may comprise vertically-extending pins, and the first and second interface elements 109*a*, 109*b* of the substrate carrier 105 may comprise horizontally-extending grooves adapted to kinematically couple with the pins. Other kinematic arrangements are possible.

Figure 2:
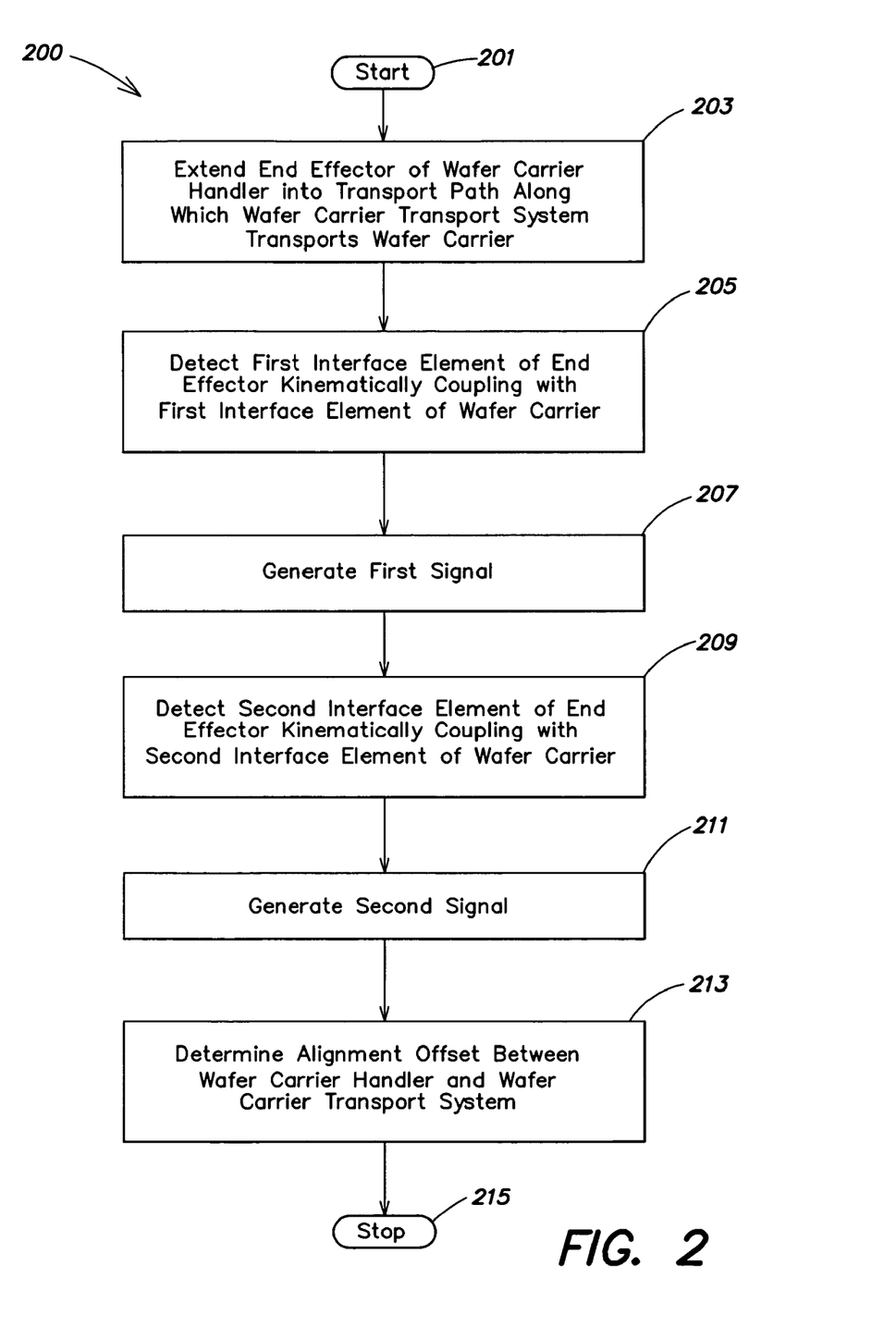
FIG. 2 is a flowchart illustrating an exemplary inventive process for determining an alignment offset between a substrate carrier handler and a substrate carrier transport system.

FIG. 2 provides a flowchart that illustrates an exemplary inventive process 200 for determining an alignment offset between a substrate carrier handler and a substrate carrier transport system. For the purposes of the present process 200, the substrate carrier handler may comprise the end effector 101 shown in FIG. 1, which may be adapted to move along an extension path 111 (FIG. 1), and the substrate carrier transport system may be represented by the substrate carrier 105 shown in FIG. 1, which may be adapted to move along a transport path 113 (FIG. 1). The present process 200 may begin with a step 201, and proceed therefrom to step 203.

In the step 203, the end effector 101 (FIG. 1) of the substrate carrier handler is extended into the transport path 113 (FIG. 1) along which the substrate carrier transport system transports the substrate carrier 105 (FIG. 1). For example, the end effector 101 may be lifted into the transport path 113 along the extension path 111, and it may be intended that the extension path 111 be both substantially straight, and, at least from the prospective of the substrate carrier 105, which may (or may not) be moving, substantially vertically-oriented. The step 203 may further include so extending the end effector 101 sufficiently to cause kinematic coupling between complementary interface elements of the end effector 101 and the support member 103 as a precursor to detection steps relating to same and as discussed below.

At step 205, a first event is detected comprising the first interface element 107*a* of the end effector 101 kinematically coupling with the first interface element 109*a* of the substrate carrier 105. For example, one or more local or remote sensors may be employed, e.g., to detect such a kinematic coupling when it takes place, or to detect the existence of such a kinematic coupling after it has been brought about. An example of a local sensor adapted to perform this function is described below with reference to FIG. 4. Other sensor implementations are possible.

At a step 207, a first signal is generated corresponding to the first event described above, i.e., the first interface element 107*a* kinematically coupling with the first interface element 109*a*. For example, in response to detecting the first event as described above, the one or more sensors may be employed to generate the first signal, indicating that kinematic coupling exists between the first interface element 107*a* and the first interface element 109*a*.

At a step 209, a second event is detected comprising the second interface element 107*b* of the end effector 101 kinematically coupling the second interface element 109*b* of the substrate carrier 105. For example, one or more local or remote sensors may be employed, e.g., to detect such a kinematic coupling when it takes place, or to detect the existence of such a kinematic coupling after it has taken place. An example of a local sensor adapted to perform this function is described below with reference to FIG. 4. Other sensor implementations are possible.

At a step 211, a second signal is generated corresponding to the second event described above, i.e., the second interface element 107*b* kinematically coupling with the second interface element 109*b*. For example, in response to detecting the second event as described above, the one or more sensors may be employed to generate the second signal, indicating that kinematic coupling exists between the second interface element 107*b* and the second interface element 109*b*.

At a step 213, an alignment offset between the substrate carrier transport system is determined. For example, a controller may be employed to receive the first and second signals, and determine the alignment offset based on the first and second signals. In one or more such embodiments, the difference in time between when the controller receives the first signal and the second signal may be controlled so as to be equivalent to the difference in time between when the first event occurred and when the second event occurred. If the length of this time interval is longer or shorter, to any significant extent, than that length of time which would be expected if good alignment existed, the controller can be employed to indicate the existence of an alignment offset, and/or to calculate a numerical value which may be interpreted as a measurement of an alignment offset found to exist.

For example, the measurement may correspond to an angular offset between the course or trajectory described by a path through which the substrate carrier handler was intended to extend the end effector 101, and the course or trajectory described by the extension path 111 through which the substrate carrier handler actually extended the end effector 101. Alternatively, the measurement may correspond to an angular offset between a plane within which the support member 103 of the end effector 101 was intended to be disposed during extension of the end effector 101 into the transport path 113 (e.g., a plane that, though moving relative to a corresponding datum plane (not shown) of the substrate carrier, was intended to remain parallel to the same), and the plane within which the support member 103 of the end effector 101 was actually disposed during extension of the end effector 101. Still further, the measurement may correspond to a linear distance along the extension path 111 between where the end effector 101 was expected to achieve kinematic coupling between the second interface elements 107*b*, 109*b* (i.e., relative to where the end effector 101 was when the second kinematic coupling event took place), and where the end effector 101 was when it actually achieved such kinematic coupling.

Although the present process 200 illustrated in the flow chart of FIG. 2 concludes at a step 215, i.e., after determination of the alignment offset, additional steps may be taken. For example, if the end result of the step 213 was to determine that an unacceptable alignment offset exists between the substrate carrier handler and the substrate carrier transport system, the substrate carrier handler may, e.g., be deactivated and/or removed from service, pending service to correct the offset. Alternatively, if the end result of the step 213 was to determine an actual numerical (e.g., angular or distance) value for the alignment offset, the next step may be, e.g., to adjust the posture or position of a frame that supports the substrate carrier handler, or to adjust the configuration of the substrate carrier handler itself, so as to eliminate the offset and/or reduce it to an acceptable value. Examples of apparatus and methods adapted to correct for such an offset are disclosed in copending U.S. patent application Ser. No. 60/520,180, filed Nov. 13, 2003, (AMAT No. 8158) which is hereby incorporated herein in its entirety. Other next steps are possible.

Figure 3:
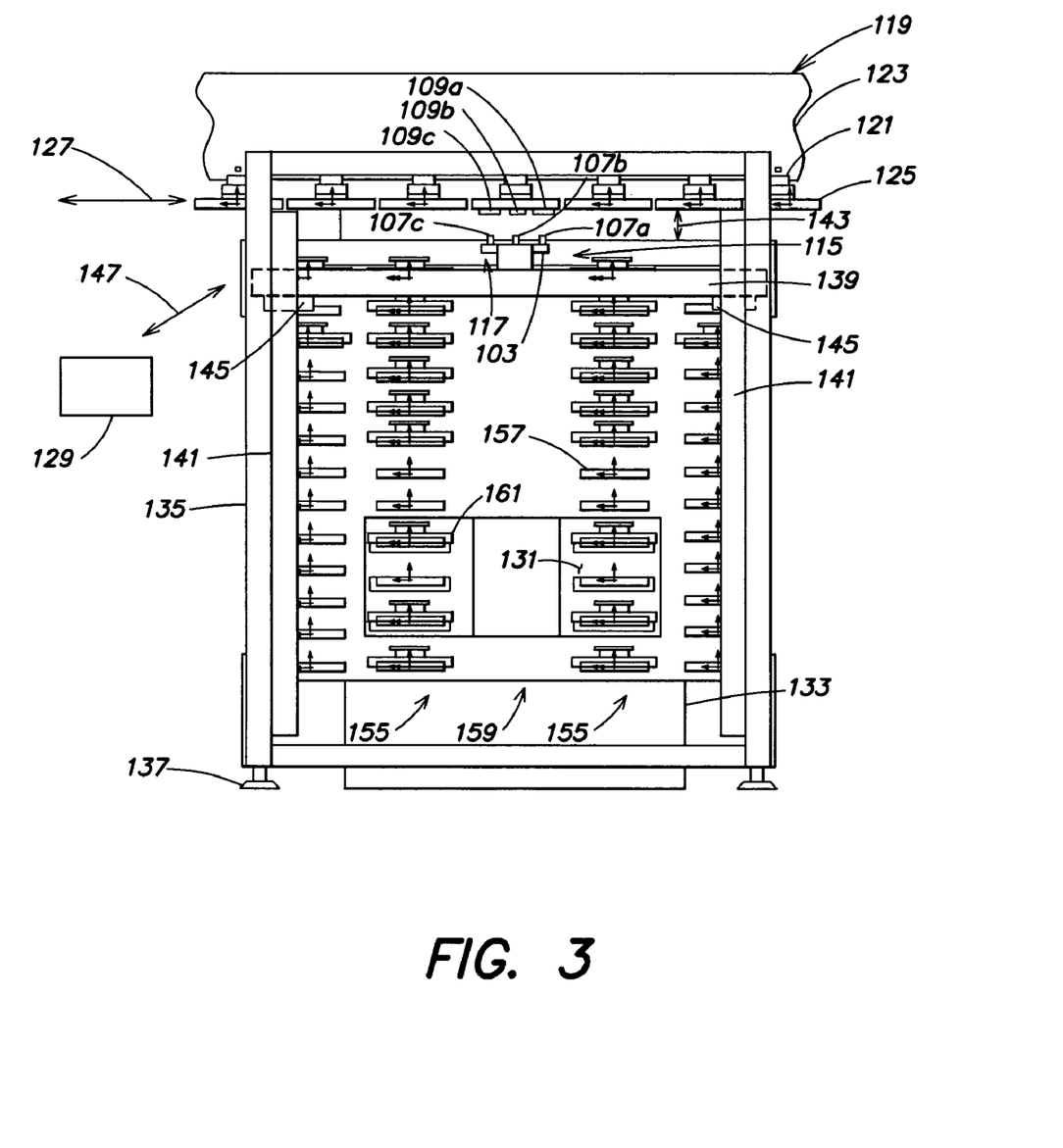
FIG. 3 is a side elevational view of an inventive apparatus for storing and moving substrate carrier handlers.

FIG. 3 is a side view of inventive apparatus for storing and moving substrate carriers, including a substrate carrier handler 115 equipped with an end effector 117, a substrate carrier transport system 119 which may be equipped with a plurality of substrate carrier supports 121 suspended from a rotating band (or belt) 123 such that the substrate carrier transport system 119 is adapted to transport substrate carriers 125 along a transport path 127, and a controller 129 adapted to receive signals from one or more sensors (not shown) adapted to detect kinematic coupling between the end effector 117 and substrate carriers 125. The transport path 127 may coincide with a location within a manufacturing facility of a factory interface 131 of a substrate processing station 133.

The substrate carrier handler 115 may be coupled to a frame 135 that may be adapted to be easily repositionable within the manufacturing facility, and that may be adapted to facilitate adjustment of its posture. For example, the frame 135 may be of modular construction so as to permit the substrate carrier handler 115 both to be installed adjacent to the substrate carrier transport system 119 at the factory interface 131 of the substrate processing station 133 for selectively exchanging substrate carriers 125 with the substrate processing station 133, and to be subjected to minor repositioning and/or reorientation along the floor of the manufacturing facility for purposes of good alignment of the substrate carrier handler 115 with the substrate carrier transport system 119 and/or the factory interface 131. Also, for example, the frame 135 may comprise height-adjustment feet 137 located at bottom corners of the frame for adjustment of frame posture.

The substrate carrier transport system 119 may further comprise both vertical and horizontal guides to facilitate movement along both the x-axis (e.g., along the transport path 127) and the z-axis (e.g., vertical). For example, the substrate carrier handler 115 may comprise a horizontal guide 139 adapted to provide movement of the end effector 117 along the transport path 127 in such a way as to match a speed of rotation of the rotating band 123 (and/or of the substrate carriers 125 being supported thereon for traveling along a stationary band or belt 123), and to match a position of a particular substrate carrier 125, whether it is being moved along the transport path 127 or is at rest. As another example, the substrate carrier handler 115 may comprise one or more vertical guides 141 adapted to extend and/or retract the end effector 117 along an extension path 143 into and out of the transport path 127 so as to permit the substrate carrier handler 115 to pick and place substrate carriers 125 onto and off of the substrate carrier supports 121 of the substrate carrier transport system 119. The horizontal guide 139 may be coupled to the one or more vertical guides via one or more mounts 145. Such mounts 145 may themselves permit adjustment along one or more axes in the connection between the horizontal and vertical guide such that a position and/or an orientation of the horizontal guide relative to the vertical guides may be adjusted as necessary, e.g., to relieve the vertical guides of lateral stress (such as from thermal expansion/contraction or from frame twist arising from adjustment of the height-adjusting feet), or as desired, e.g., to fine-tune an alignment between the substrate carrier handler 115 and the substrate carrier supports 121 so as to facilitate high-speed exchanges of substrate carriers 125.

The end effector 117 of the substrate carrier handler 115 may be similar to the end effector 101 of FIG. 1, e.g., in that the end effector 117 comprises a support member 103 and first and second interface elements 107a, 107b, and the substrate carriers 125 may be similar to the substrate carrier 105 of FIG. 1 in that they comprise first and second interface elements 109a, 109b that are complementary to and are adaptable to respectively kinematically couple with the first interface element 107a and the second interface element 107b of the end effector 117. As shown in FIG. 3, the end effector 117 of the substrate carrier handler 115 may further comprise a third interface element 107c, and the substrate carriers 125 may further comprise a third interface element 109c that is complementary to and is adapted to kinematically couple with the third interface element 107c of the end effector 117. As well, the apparatus of FIG. 3 may be adapted to generate a third signal corresponding to a third event comprising kinematic coupling between the third interface element 107c of the end effector 117 and the third interface element 109c of the substrate carrier 125. For example, the apparatus of FIG. 3 may comprise one or more sensors adapted to detect the third event and generate the third signal in response thereto. Those of ordinary skill in the art will recognize that a third signal corresponding to this third event may provide even more utility to a system already adapted to generate respective first and second signals corresponding to the first and second events as described above. For example, if the first and second pairs of interface elements are spaced apart along the y-axis such that an alignment offset corresponding to a misalignment in roll may be determined from the first and second signal (i.e., from the first and second coupling events), a third pair of interface elements as provided in FIG. 3, spaced apart along the x-axis from both the first and second pairs, may facilitate determination of a similar misalignment in pitch. Other uses/applications for additional sensors are possible as will be apparent to those of ordinary skill in the art.

The controller 129 may be one or more of any number of suitable devices, e.g., it may be a microcontroller or microprocessor, and may be disposed locally or remotely, e.g., at a central processing location adapted to perform determinations for multiple substrate carrier handlers like the substrate carrier handler 115. Connections 147 between the one or more sensors for detecting kinematic coupling events and the controller 129 may also be accomplished in one or more of any number or suitable ways, e.g., via wires or RF broadcast.

Figure 4:
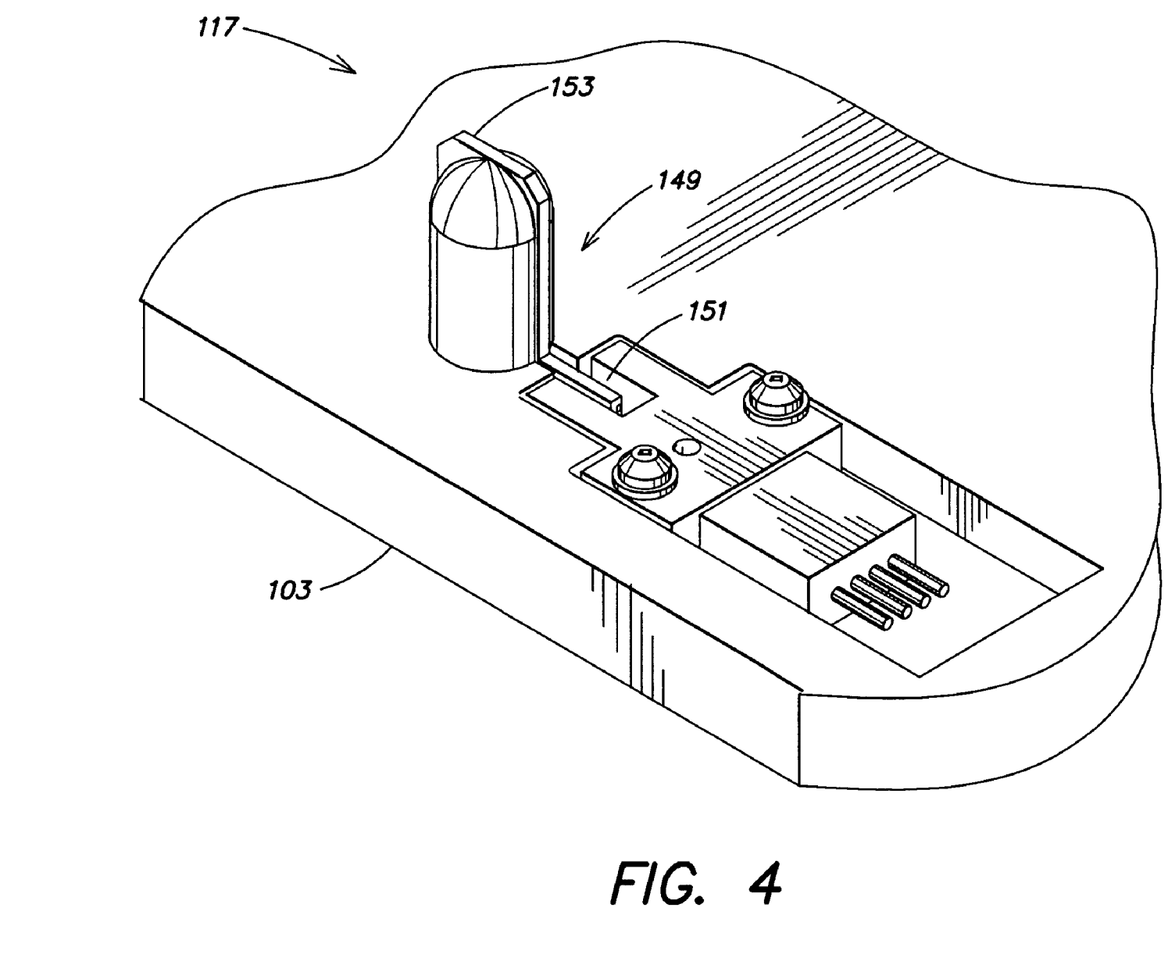
FIG. 4 is downward perspective view of an exemplary embodiment of a sensor adapted to detect a kinematic coupling event in accordance with the present invention.

FIG. 4 is a downward perspective view of an exemplary embodiment of a sensor 149 adapted to detect at least one of the first, second or third kinematic coupling events described above. For example, the substrate carrier handler 115 may be equipped with three such sensors 149, with each sensor 149 being disposed on or integrated within the support member 103 of the end effector 117 of the substrate carrier handler 115 adjacent one of the first, second and third interface elements 107a-c of the end effector 117. Each sensor 149 may comprise a through beam sensor 151 and an actuatable element 153 adapted to deflect downward as the pair of interface elements begins to kinematically couple so as to reach a blocking position relative to the beam sensor 151 only when proper kinematic coupling exists between the interface elements of the pair. In response to such a blocking of the through-beam, the sensor 149 may be adapted to generate a signal (e.g., corresponding to one of the first, second and third signals described above). Methods of use and further apparatus descriptions of the sensor 149 are disclosed in U.S. Pat. No. 6,573,522, issued Jun. 3, 2003, which is hereby incorporated herein in its entirety. Other types of sensors are possible, such as contact-type sensors providing for completion of an electrical circuit through the interface elements of the substrate carrier, as shown in U.S. Pat. No. 6,389,707 to Peiter et al., issued May 21, 2002, as well as other types of actuatable sensors such as are shown/discussed in U.S. Pat. No. 6,755,221, issued Jun. 29, 2004.

Referring again to FIG. 3, the inventive apparatus may further comprise columns 155 of storage shelves 157 adapted to provide temporary storage of substrate carriers 125 when direct movement of substrate carriers 125 between the substrate carrier transport system 119 and the factory interface 131 is not convenient/desired, and one or more open columns 159 through which the end effector 117 may be lifted or lowered during substrate carrier movement operations. Each column 155 may be disposed next to an open column 159. Alternatively, and as shown in FIG. 3, one or more columns 155 may be spaced apart from the nearest open column 159 such that another column 155 is disposed between them. More than one open column 159 is possible, and fewer or more than four columns 155 are possible, depending upon the distance between factory interfaces 131 along the transport path 127, and local storage needs. Movement of all substrate carriers 125 by the substrate carrier handler 115 may be confined to a substantially vertical plane containing the transport path 127, loadports 161 of the factory interface 131, and the shelves 157 of the columns 155, e.g., to provide an economy of time and travel distance of substrate carriers 125.

The foregoing description discloses only embodiments of the invention, modification of the above-described apparatus and methods which fall within the scope of the invention will be readily apparent to those of ordinary skill in the art. For instance, it will be understood by those of ordinary skill in the art, that other mounting configurations of actuatable elements, such as an actuatable element operatively mounted around a vertically-oriented kinematic pin, (e.g., as disclosed in U.S. Pat. No. 5,970,621 issued Oct. 26, 1999) rather than within the same as shown in FIG. 4, may be employed to facilitate detection of kinematic coupling events, and still fall within the scope of the present invention.

Similarly, although detection of an alignment offset using the methods and apparatus of the present invention may be performed in conjunction with monitoring for the existence or extent of intervals of time or distance separating kinematic coupling events intended to occur simultaneously and/or at the same point of extension of the end effector into the transport path, other arrangements are similarly possible, such as an interval of an expected non-zero extent being monitored for variation therefrom, indicating misalignment. Such embodiments may include the employment of interface elements of an end effector disposed on different support elements of an end effector, for example, or on different end effectors.

Other adjustment schemes may be employed, for instance, when correcting for an alignment offset determined in accordance with the present invention, for example, adjusting the position and/or orientation of the transport path through which the substrate carrier transport system transports substrate carriers. As well, other types of relationships between the substrate carrier handler and the transport path than a vertically-oriented arrangement are possible, for instance, horizontally-oriented arrangements are possible (e.g., wherein the end effector may be adapted to push, but not necessarily carry, the substrate carrier upon kinematic engagement) as are arrangements involving curved transport paths.

Finally, movable portions of a substrate carrier handler other than end effectors may be employed to determine an alignment offset between the substrate carrier handler and a substrate carrier transport system. For instance, movable portions not necessarily adapted to pick and place substrate carriers may be employed in the manner of a dedicated alignment probe. Also, complimentary interface elements of an item on the substrate carrier transport system that is not a substrate carrier, such as a calibration jig, may be employed to cooperate with the movable portion of the substrate carrier handler to determine an alignment offset. As used herein, the term substrate carrier will include calibration jigs used to represent a substrate carrier (e.g., during calibration).

In a further aspect, the interface elements of the substrate carrier handler may be employed to detect plurality of a shelf (e.g., of a stocker) or a docking station (e.g., where substrate carriers are opened for substrate extraction, such as at a processing station).

The present application is related to commonly-assigned co-pending U.S. patent application Ser. No. 10/650,480, filed Aug. 28, 2003, entitled "Substrate Carrier Handler that Unloads Substrate Carriers Directly from a Moving Conveyor" and commonly-assigned co-pending U.S. patent application Ser. No. 60/443,087, filed Jan. 27, 2003, entitled "Methods and Apparatus for Transporting Wafer Carriers", both of which are hereby incorporated by reference herein in their entirety.

While the present invention has been described primarily with reference to wafers, it will be understood that the invention also may be employed with other substrates such as a silicon substrate, a mask, a reticle, a glass plate, etc., whether patterned or unpatterned; and/or with apparatus for transporting and/or processing such substrates.

In one or more other embodiments of the invention, a plunger-type or similar switch may be employed to sense the nesting of a kinematic pin (of an end effector) into a kinematic groove (of a substrate carrier). In such an embodiment, the switch preferably is located as close to the kinematic coupling location as possible. An exemplary plunger switch may be a Microswitch P/N 12SM4-T, an Omron EE-SA switch, or the like. Alternatively, a plunger that contacts a switch pad on the bottom of a substrate carrier may be used to trigger a through beam switch (e.g., so as to block a light beam or cause a light beam to be transmitted in response to activation of the switch). Further, a protrusion may be formed on the bottom of a substrate carrier adjacent a kinematic coupling point. Such a protrusion may be configured to break a light beam of a through beam sensor during kinematic coupling. One exemplary through beam sensor is a SunX PKM-54 PhotoMicro sensor, although other sensor types may be used (e.g., other through beam sensors, reflective sensors, etc.). Use of through beams eliminates the need for contact during sensing of kinematic feature nesting (e.g., reducing particle generation and perturbations introduced into a substrate carrier that might otherwise result from a plunger-type switch or similar configuration).

Accordingly, while the present invention has been disclosed in connection with particular embodiments thereof, it should be understood that other embodiments may fall within the spirit and scope of the invention, as described by the following claims.

The invention claimed is:

1. A method of determining an alignment offset between a substrate carrier handler and a substrate carrier transport system, the method comprising:
    providing a substrate carrier handler, the substrate carrier handler comprising a movable portion adapted to extend into a transport path along which a substrate carrier transport system transports substrate carriers, the movable portion further comprising a plurality of interface elements adapted to kinematically couple with respective complementary interface elements of a substrate carrier being transported along the transport path by the substrate carrier transport system;
    extending the movable portion into the transport path;
    detecting a first event comprising a first interface element of the movable portion kinematically coupling with a complementary first interface element of the substrate carrier;
    generating a first signal in response to the first event;
    detecting a second event comprising a second interface element of the movable portion kinematically coupling with a complementary second interface element of the substrate carrier;
    generating a second signal in response to the second event; and
    determining an alignment offset between the substrate carrier handler and the substrate carrier transport system based on the first and second signals by determining that an alignment off set exists between the substrate carrier handler and the substrate carrier transport system in excess of a predetermined acceptable alignment offset.

2. The method of claim 1, wherein providing a substrate carrier handler further comprises providing a sensor adapted to detect at least one of the first event and the second event.

3. The method of claim 2, wherein providing a sensor adapted to detect at least one of the first event and the second event comprises disposing at least a portion of the sensor on the movable portion of the substrate carrier handler.

4. The method of claim 2, wherein providing a sensor adapted to detect at least one of the first event and the second event comprises disposing at least a portion of the sensor on the substrate carrier.

5. The method of claim 1, wherein providing a substrate carrier handler further comprises providing a first sensor adapted to detect the first event and a second sensor adapted to detect the second event.

6. The method of claim 1, wherein providing a substrate carrier handler further comprises: providing at least one vertically-oriented pin comprising one of the first and second interface portions of the movable portion.

7. The method of claim 6, wherein providing at least one vertically-oriented pin comprises mounting the at least one vertically-oriented pin on a substrate carrier support member of the movable portion.

8. The method of claim 1, wherein providing a substrate carrier handler further comprises providing at least one actuatable element adapted to actuate via one of the first and second events.

9. The method of claim 8, wherein providing at least one actuatable element comprises providing a first actuatable element adapted to actuate via the first event and providing a second actuatable element adapted to actuate via the second event.

10. The method of claim 8, wherein providing a substrate carrier handler comprises providing a vertically-oriented pin comprising one of the first and second interface elements of the movable portion and operatively mounting an actuatable element to the vertically-oriented pin such that the actuatable element actuates via the corresponding one of the first and second events.

11. The method of claim 10, wherein operatively mounting the actuatable element to the vertically-oriented pin comprises operatively mounting the actuatable element to the vertically-oriented pin such that the actuatable element occupies a deflected position when kinematic coupling exists between the respective interface elements of the movable portion and the substrate carrier.

12. The method of claim 1, wherein extending the movable portion into the transport path comprises matching an elevation of the movable portion to an elevation of the transport path.

13. The method of claim 12, wherein matching an elevation of the movable portion to an elevation of the transport path comprises raising the movable portion into the transport path.

14. The method of claim 1, wherein extending the movable portion into the transport path comprises matching a speed of the movable portion to a speed at which the substrate carrier transport system transports substrate carriers along the transport path.

15. The method of claim 14, wherein extending the movable portion into the transport path further comprises matching a position of the movable portion along the transport path with a position of a substrate carrier along the transport path.

16. The method of claim 1, wherein at least one of detecting a first event and detecting a second event comprises detecting actuation of an actuatable element operatively mounted to one of the first and second interface elements of the movable portion.

17. The method of claim 16, wherein detecting actuation of an actuatable element comprises detecting a deflected position of the actuatable element.

18. The method of claim 1, wherein determining an alignment offset between the substrate carrier handler and the substrate carrier transport system based on the first and second signals comprises determining a divergence between a predetermined preferred path and an observed path of extension of the movable portion into the transport path.

19. The method of claim 18, wherein determining a divergence between a predetermined preferred path and an observed path of extension of the movable portion into the transport path comprises determining an angular divergence between the predetermined preferred path and the observed path.

20. The method of claim 1, wherein determining an alignment offset between the substrate carrier handler and the substrate carrier transport system based on the first and second signals comprises determining an angular divergence between a predetermined preferred orientation of the movable portion and an observed orientation of the movable portion as it extends into the transport path.

21. The method of claim 1, wherein determining an alignment offset between the substrate carrier handler and the substrate carrier transport system based on the first and second signals comprises determining an extent of a first interval separating the first event and the second event.

22. The method of claim 21, wherein determining an extent of a first interval separating the first and the second event comprises determining an extent of a first time interval separating the first event and the second event.

23. The method of claim 21, wherein determining an extent of a first interval separating the first and the second event comprises determining a distance interval along a path of extension of the movable portion into the transport path.

24. The method of claim 1, wherein providing a substrate carrier handler further comprises mounting the substrate carrier handler to a modular frame adapted to support the substrate carrier handler and to be moved adjacent a substrate carrier transport system so as to permit the substrate carrier handler to exchange substrate carriers with the substrate carrier transport system.

25. A method of correcting for an alignment offset between a substrate carrier handler and a substrate carrier transport system, the method comprising:
performing a method of determining an alignment offset between a substrate carrier handler and a substrate carrier transport system in accordance with claim 1; and
adjusting one of a position and an orientation of the substrate carrier handler relative to the substrate carrier transport system to the extent of the determined alignment offset.

26. A substrate carrier handler, comprising;
a movable portion adapted to extend into a transport path along which a substrate carrier transport system transports a substrate carrier, the movable portion having a plurality of interface elements adapted to kinematically couple with respective complementary interface elements of the substrate carrier;
a first sensor adapted to detect a first event comprising a first interface element of the movable portion kinematically coupling with a complementary first interface element of the substrate carrier, and to generate a first signal in response to the first event;
a second sensor adapted to detect a second event comprising a second interface element of the movable portion kinematically coupling with a complementary second interface element of the substrate carrier, and to generate a second signal in response to the second event; and
a controller adapted to receive the first and second signals, and to determine an alignment offset between the substrate carrier handler and the substrate carrier transport system based on the first and second signals at least in part by determining an extent of a first interval separating the first event and the second event.

27. The substrate carrier handler of claim 26, further comprising a modular frame on which the movable portion is supported, and with respect to which the movable portion is adapted to move when extending into the transport path.

28. The substrate carrier handler of claim 27, wherein the modular frame is adapted to permit adjustment of a path of extension of the movable portion into the transport path.

29. The substrate carrier handler of claim 28, wherein the modular frame further comprises adjustable-height feet to permit adjustment of the path of extension of the movable portion.

30. The substrate carrier handler of claim 28, further comprising an adjustable linkage between the modular frame and the movable portion.

31. The substrate carrier handler of claim 26, further comprising horizontal and vertical guides along which the movable portion is adapted to move.

32. The substrate carrier handler of claim 31, further comprising an adjustable linkage between the guides and the movable portion.

33. The substrate carrier handler of claim 31, further comprising an adjustable linkage between the horizontal guide and the vertical guide.

34. The substrate carrier handler of claim 27, wherein the substrate carrier handler is adapted to extend the movable element into the transport path so as to match an elevation of the movable element with an elevation of the transport path.

35. The substrate carrier handler of claim 34, wherein the substrate carrier handler is adapted to raise the movable portion into the transport path.

36. The substrate carrier handler of claim 34, wherein the substrate carrier handler is further adapted to move the movable portion along the transport path at a speed at which the substrate carrier transport system transports the substrate carrier along the transport path.

37. The substrate carrier handler of claim 36, wherein the substrate carrier handler is further adapted to match a moving position of the movable portion along the transport path with a moving position of the substrate carrier along the transport path.

38. The substrate carrier handler of claim 26, wherein the movable portion is an end effector adapted to pick up and deliver substrate carriers.

39. The substrate carrier handler of claim 26, wherein the movable portion comprises a substrate carrier support portion, and the interface elements of the plurality of interface elements of the movable portion are disposed on the support portion.

40. The substrate carrier handler of claim 39, further comprising horizontal and vertical guides along which the movable portion is adapted to move, and an adjustable linkage between the support portion of the movable portion and the guides.

41. The substrate carrier handler of claim 26, wherein at least one of the first and second sensors is at least in part disposed on the movable portion.

42. The substrate carrier handler of claim 26, wherein one of the first and second sensors comprises an actuatable element adapted to actuate via one of the first and second events and a sensing element adapted to detect an actuation of the actuatable element.

43. The substrate carrier handler of claim 42, wherein the actuatable element is operatively mounted to one of the first and second interface elements of the movable portion such that when kinematic coupling exists between the respective interface elements of the movable portion and the substrate carrier, the actuatable element occupies a deflected position, and the sensing element detects the deflected position of the actuatable element.

44. The substrate carrier handler of claim 26, wherein at least one of the first and second sensors comprises a through-beam sensor.

45. The substrate carrier handler of claim 26, wherein the controller is further adapted to determine whether an alignment offset exists between the substrate carrier and the substrate carrier transport system that exceeds a predetermined acceptable alignment offset.

46. The substrate carrier handler of claim 26, wherein the first interval is a time interval.

47. The substrate carrier handler of claim 26, wherein the first interval is a distance interval along a path of extension of the movable portion into the transport path.

48. The substrate carrier of claim 26, wherein the controller is adapted to determine an alignment offset between the substrate carrier handler and the substrate carrier transport system based on the first and second signals by determining a divergence between a predetermined preferred path and an observed path of extension of the movable portion into the transport path.

49. The substrate carrier of claim 48, wherein the divergence is an angular divergence.

50. The substrate carrier handler of claim 26, wherein the controller is adapted to determine an alignment offset between the substrate carrier handler and the substrate carrier transport system based on the first and second signals by determining an angular divergence between a predetermined preferred orientation of the movable portion and an observed orientation of the movable portion as it extends into the transport path.

51. A method of determining an alignment offset between a substrate carrier handler and a substrate carrier transport system, the method comprising:
providing a substrate carrier handler, the substrate carrier handler comprising a movable portion adapted to extend into a transport path along which a substrate carrier transport system transports substrate carriers, the movable portion further comprising a plurality of interface elements adapted to kinematically couple with respective complementary interface elements of a substrate carrier being transported along the transport path by the substrate carrier transport system;
extending the movable portion into the transport path;
detecting a first event comprising a first interface element of the movable portion kinematically coupling with a complementary first interface element of the substrate carrier;
generating a first signal in response to the first event;
detecting a second event comprising a second interface element of the movable portion kinematically coupling with a complementary second interface element of the substrate carrier;
generating a second signal in response to the second event; and
determining an alignment offset between the substrate carrier handler and the substrate carrier transport system based on the first and second signals by determining a divergence between a predetermined preferred path and an observed path of extension of the movable portion into the transport path.

52. The method of claim 51, wherein determining a divergence between a predetermined preferred path and an observed path of extension of the movable portion into the transport path comprises determining an angular divergence between the predetermined preferred path and the observed path.

53. A method of determining an alignment offset between a substrate carrier handler and a substrate carrier transport system, the method comprising:
providing a substrate carrier handler, the substrate carrier handler comprising a movable portion adapted to extend into a transport path along which a substrate carrier transport system transports substrate carriers, the movable portion further comprising a plurality of interface elements adapted to kinematically couple with respective complementary interface elements of a substrate carrier being transported along the transport path by the substrate carrier transport system;
extending the movable portion into the transport path;
detecting a first event comprising a first interface element of the movable portion kinematically coupling with a complementary first interface element of the substrate carrier;
generating a first signal in response to the first event;
detecting a second event comprising a second interface element of the movable portion kinematically coupling with a complementary second interface element of the substrate carrier;
generating a second signal in response to the second event; and
determining an alignment offset between the substrate carrier handler and the substrate carrier transport system based on the first and second signals by determining an angular divergence between a predetermined preferred orientation of the movable portion and an observed orientation of the movable portion as it extends into the transport path.

54. A method of determining an alignment offset between a substrate carrier handler and a substrate carrier transport system, the method comprising:
providing a substrate carrier handler, the substrate carrier handler comprising a movable portion adapted to extend into a transport path along which a substrate carrier transport system transports substrate carriers, the movable portion further comprising a plurality of interface elements adapted to kinematically couple with respective complementary interface elements of a substrate carrier being transported along the transport path by the substrate carrier transport system;
extending the movable portion into the transport path;
detecting a first event comprising a first interface element of the movable portion kinematically coupling with a complementary first interface element of the substrate carrier;
generating a first signal in response to the first event;
detecting a second event comprising a second interface element of the movable portion kinematically coupling with a complementary second interface element of the substrate carrier;
generating a second signal in response to the second event; and
determining an alignment offset between the substrate carrier handler and the substrate carrier transport system based on the first and second signals by determining an extent of a first interval separating the first event and the second event.

55. The method of claim 54, wherein determining an extent of a first interval separating the first and the second event comprises determining an extent of a first time interval separating the first event and the second event.

56. The method of claim 54, wherein determining an extent of a first interval separating the first and the second event comprises determining a distance interval along a path of extension of the movable portion into the transport path.

57. A method of correcting for an alignment offset between a substrate carrier handler and a substrate carrier transport system, the method comprising:
performing a method of determining an alignment offset between a substrate carrier handler and a substrate carrier transport system which includes:
providing a substrate carrier handler, the substrate carrier handler comprising a movable portion adapted to extend into a transport path along which a substrate carrier transport system transports substrate carriers, the movable portion further comprising a plurality of interface elements adapted to kinematically couple with respective complementary interface elements of a substrate carrier being transported along the transport path by the substrate carrier transport system;

extending the movable portion into the transport path;

detecting a first event comprising a first interface element of the movable portion kinematically coupling with a complementary first interface element of the substrate carrier;

generating a first signal in response to the first event;

detecting a second event comprising a second interface element of the movable portion kinematically coupling with a complementary second interface element of the substrate carrier;

generating a second signal in response to the second event; and determining an alignment offset between the substrate carrier handler and the substrate carrier transport system based on the first and second signals;

adjusting one of a position and an orientation of the substrate carrier handler relative to the substrate carrier transport system to the extent of the determined alignment offset.

* * * * *